United States Patent
Seymour et al.

[11] Patent Number: 6,081,109
[45] Date of Patent: Jun. 27, 2000

[54] CURRENT SENSING DEVICE

[75] Inventors: Herbert E. Seymour; Michael S. Robbins, both of Los Angeles, Calif.

[73] Assignee: Xantech Corporation, Sylmar, Calif.

[21] Appl. No.: 08/965,816

[22] Filed: Nov. 7, 1997

[51] Int. Cl.[7] .............................................. G01R 33/00
[52] U.S. Cl. ................................... 324/127; 439/225
[58] Field of Search .................................. 324/127, 133, 324/117 R, 142; 340/660, 664; 439/225

[56] References Cited

U.S. PATENT DOCUMENTS

| | | | |
|---|---|---|---|
| 3,774,189 | 11/1973 | Brown | 340/253 B |
| 3,859,646 | 1/1975 | Schwellenbach | 340/253 R |
| 4,002,397 | 1/1977 | Wang et al. | 339/147 R |
| 4,021,732 | 5/1977 | Metcalf | 324/53 |
| 4,052,664 | 10/1977 | Pohl | 324/51 |
| 4,180,819 | 12/1979 | Nakano | 343/792 |
| 4,286,213 | 8/1981 | Fowler | 324/127 |
| 4,314,201 | 2/1982 | Marro et al. | 324/127 |
| 4,484,220 | 11/1984 | Beetner | 358/190 |
| 4,602,216 | 7/1986 | Keel | 324/126 |
| 4,701,676 | 10/1987 | Gibson | 315/362 |
| 4,710,846 | 12/1987 | Heisinger | 361/119 |
| 4,717,872 | 1/1988 | Wagner et al. | 324/127 |
| 4,749,968 | 6/1988 | Burroughs | 333/105 |
| 4,754,218 | 6/1988 | Wagner et al. | 324/127 |
| 4,793,317 | 12/1988 | Grenet | 123/557 |
| 4,901,007 | 2/1990 | Sworm | 324/110 |
| 4,995,017 | 2/1991 | Sellati et al. | 307/86 |
| 5,109,316 | 4/1992 | Murphy | 361/357 |
| 5,222,149 | 6/1993 | Palmer | 381/94 |
| 5,290,191 | 3/1994 | Foreman et al. | 439/225 |
| 5,297,015 | 3/1994 | Miyazaki et al. | 363/146 |
| 5,315,475 | 5/1994 | Scheidel et al. | 361/643 |
| 5,358,429 | 10/1994 | Mina | 439/695 |
| 5,428,288 | 6/1995 | Foreman et al. | 324/142 |
| 5,436,557 | 7/1995 | Erickson | 324/127 |
| 5,465,013 | 11/1995 | Bassen et al. | 307/91 |
| 5,467,062 | 11/1995 | Burroughs | 333/124 |
| 5,522,731 | 6/1996 | Clark et al. | 439/108 |
| 5,525,068 | 6/1996 | Graham et al. | 439/114 |
| 5,526,225 | 6/1996 | Wang | 361/643 |
| 5,529,517 | 6/1996 | Hopf et al. | 439/843 |
| 5,531,604 | 7/1996 | Huang | 439/79 |
| 5,540,596 | 7/1996 | Bothe et al. | 439/76.1 |
| 5,541,457 | 7/1996 | Morrow | 307/38 |
| 5,541,800 | 7/1996 | Misencik | 361/45 |
| 5,553,915 | 9/1996 | Deans | 439/678 |
| 5,831,426 | 11/1998 | Black | 324/127 |
| 5,841,272 | 11/1998 | Smith | 324/127 |

*Primary Examiner*—Vinh P. Nguyen
*Assistant Examiner*—Russell M. Kobert
*Attorney, Agent, or Firm*—Wm Bruce Day

[57] ABSTRACT

A current sensing wafer fits about the blades of an AC power cord and is connectible to peripheral equipment for sensing when current is being drawn through the power cord, and thereby indicating when a power consuming device using the power cord is operating. The wafer, in a preferred embodiment, comprises an insulating substrate which has thereon a loop of ferromagnetic material. Slots for fitting about the twin blades of an AC power cord plug extend through the wafer and the loop of ferromagnetic material extends about the slots, generally in a FIG. 8 pattern. This arrangement, extending about the positive and negative conductors, creates a magnetic current in the loop. A sensor coil is integrated into the loop and includes an amplifier circuit for signaling controlled peripheral equipment that current is flowing through the AC power cord, and therefor, electrical devices using the current are operating. The wafer device is particularly useful for remote control of home entertainment system devices, as it allows a controller to know if an item of equipment is operating.

7 Claims, 2 Drawing Sheets

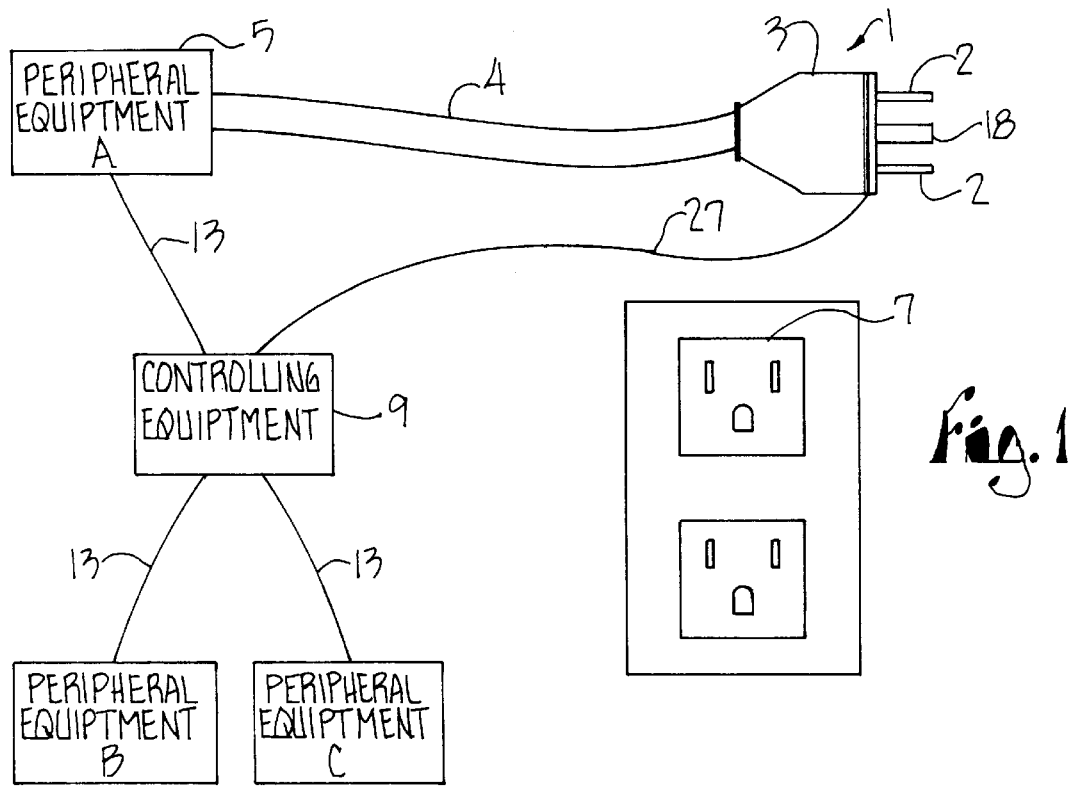
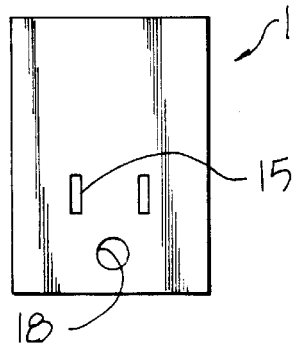
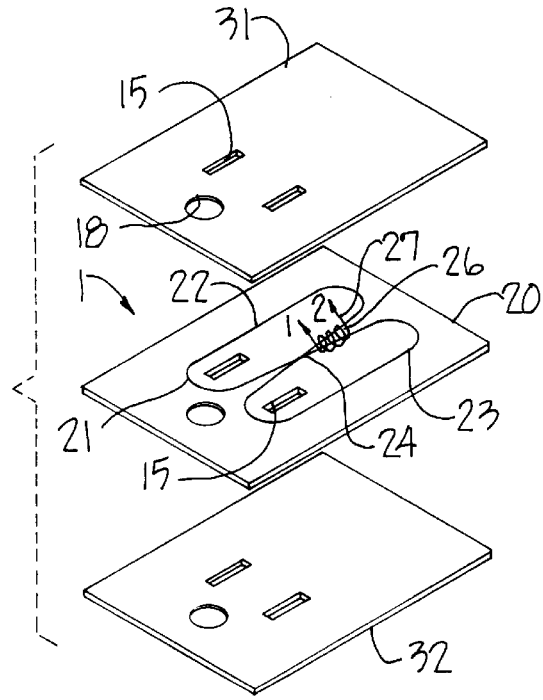
Fig. 1
Fig. 2
Fig. 3

6,081,109

CURRENT SENSING DEVICE

FIELD OF THE INVENTION

This invention relates to electrical current sensing devices and in particular, to a device which senses whether current is flowing through an AC power cord.

BACKGROUND OF THE INVENTION

Many devices have been used previously for determining whether electrical current is being drawn through AC power lines. Some of these, such as the Watt Watcher device disclosed in U.S. Pat. No. 4,717,872 are used to control power consumption. The Watt Watcher device is substantially a clamp that fits about an AC power cord and uses an induction type sensor. Other types of induction sensors, which generally consist of a ring or clamp encircling a power line, are well known, such as Bubash, U.S. Pat. No. 5,015,944. Some of these devices are complex and are not readily adaptable for connection to feedback circuits to control electrically operated equipment.

It is therefore an object of the present invention to provide a power monitoring circuit for indicating whether current is flowing through an AC power cord. Another object of the invention is to provide a device which simply slips on to the plug blades of an AC power cord and does not require removal and re-wiring of the cord. Yet another object of the present invention is to provide a device that readily connects to controlling devices to provide an indication of power flow.

Other objects and advantages of the present invention will be apparent to those skilled in the art from the following Summary of the Invention and Description of the Preferred and Alternate Embodiments.

SUMMARY OF THE INVENTION

A current sensing device fits about the blades of an AC power cord and has a sensor coil which provides a signal to control equipment. The current sensor consists of a wafer with slots to fit over the power cord blades with the wafer generally consisting of insulating material having a ferromagnetic loop extending about at least one of the blade slots. The loop is preferably generally in the configuration of a FIG. 8 so that the loop segments extend around each of the slots and about each of the blades. The blades carry opposing currents from the two conductors which add to create a magnetic current in the loop which is of a signal strength sufficient to be readily sensed. A sensor coil integrated with the ferromagnetic loop generates an electrical current responsive to a change in current flow in the blades of the AC power cord. Alternatively, the wafer could be of ferromagnetic material having slots therethrough, which would form a ferromagnetic loop. All embodiments provide for insulating layers or coverings over the material comprising the ferromagnetic loop.

BRIEF DESCRIPTION OF THE DRAWINGS

FIG. 1 is a diagrammatic view showing a current sensing device embodying the present invention and mounted on an AC power cord plug and connecting to controlling equipment.

FIG. 2 is a plan view of the current sensing device.

FIG. 3 is a disassembled view of a preferred embodiment of the current sensing device.

DESCRIPTION OF THE PREFERRED AND ALTERNATE EMBODIMENTS

Figure 4:
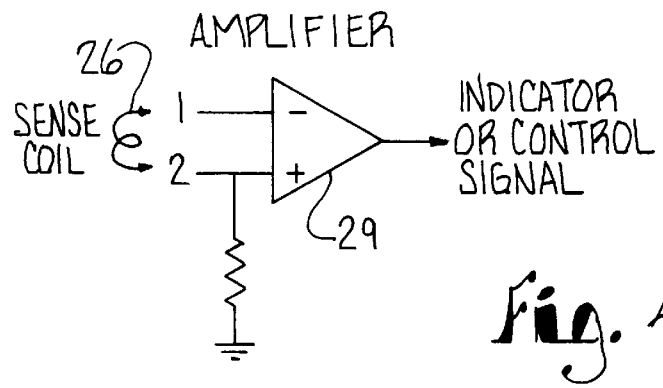
FIG. 4 is a diagrammatic view of an amplifier circuit used in the current sensing device.

As required, detailed embodiments of the present invention are disclosed herein; however, it is to be understood that the disclosed embodiments are merely exemplary of the invention which may be embodied in various forms. Therefore, specific structural and functional details disclosed herein are not to be taken as limiting, but merely as a basis for the claims and as a representative basis for teaching one skilled in the art to variously employ the present invention in virtually any appropriately detailed structure.

The reference numeral 1, FIG. 1, generally designates a current sensing device embodying the present invention and which is shown fitted on the blades 2 of a plug 3 on the end of an AC power cord 4. The power cord 4 is connected to an item of peripheral equipment 5, such as CD player, tape deck, satellite dish receiver, television, or other item of home entertainment equipment, although use of the current sensing device 1 is not limited to home entertainment equipment. The current sensing device 1 is preferably in the form of a thin wafer which is sufficiently thin to fit about the blades 2, yet permit the plug 5 to be plugged into a standard electrical wall outlet 7. A lead 8, which will be below explained, extends from the current sensing device 1 and provides input to controlling equipment 9 which in turn is wired or otherwise connected to peripheral equipment 5, 11 and 12. The current sensing device 1 senses when sufficient current is flowing through the AC power cord 4 to cause operation of the equipment, and in that manner signal that the equipment is turned on.

Accordingly, a signal indicating a current flow is transmitted through leads 13 to the controlling equipment 9 so that it determines that a particular item of peripheral equipment 5, 11 or 12 is presently in a quiet state or in a run condition and does not signal the equipment 5, 11 or 12 to turn off or on when the opposite condition is called for. For example, a user might actuate the controlling equipment 9 to turn on a CD player, such as the item of peripheral equipment 5. If the CD player was already running, an input signal through leads 13 would turn the CD player off. With the current sensing device 1, the controlling equipment would already know if the CD player was operating and internal circuitry would not send a power signal to the CD player.

In general form, the current sensing device 1 comprises a slip-on wafer have a ferromagnetic loop encircling at least one of the slots for the blades of an AC power cord plug. A magnetic current is generated in the loop in response to a change in current through the blade and transmitted to the controlling equipment 9 via the lead 13. An amplifier circuit such as shown in FIG. 4 may be included in the current sensing device.

A preferred embodiment is shown in connection with FIGS. 2 and 3 wherein is disclosed a wafer device 1 having slots 15 for the blades 2 and a hole 17 for the grounding prong 18 of the plug 3. The device 1 is formed of an insulating substrate 20 on which is laminated, printed, deposited or otherwise affixed a ferromagnetic loop 21 such as may be in the form of a FIG. 8 having segments 22 and 23 and a common trace 24 or other juncture portion, generally located between the blade slots 15. This configuration of ferromagnetic loop causes opposing magnetic currents created in the segments 22 and 23 by the opposite charges in the blades 2 to add, creating an easily detectable magnetic current in the loop 21. A sensing coil is integrated into the ferromagnetic loop and generates an electrical current responsive to the change in current in the plug blades. In the example shown in FIG. 3, a sensing coil 26 is wrapped about the loop 21 at the juncture 24 and has leads 27 extending from the device 1 for connection to an amplifier circuit, such as the amplifier circuit 29 shown in FIG. 4. Appropriate leads from the amplifier circuit are used as an input to controlling equipment 9, FIG. 1.

Completing the structure shown in FIG. 3 are insulating layers 31 and 32 which cover top and bottom, or opposite, surfaces of the substrate 20. The layers may be separate structural units in a sandwich construction as shown in FIG. 3 to add strength to the device 1 or may be a laminate or coating.

Figure 5:
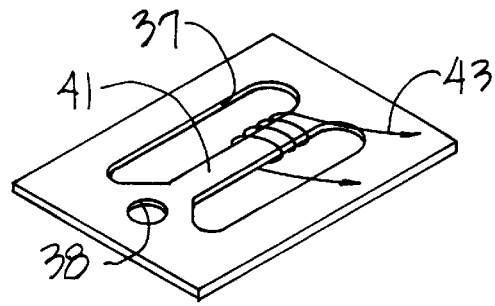
FIG. 5 is a perspective view of an alternate embodiment of the current sensing device.

An alternate embodiment 34 is shown in connection with FIG. 5 in which the middle substrate layer 20 of FIG. 3 is replaced by a ferromagnetic wafer 36 which has punched or otherwise fabricated therein slots 37 and a prong hole 38 to accommodate the blades 2 and prong 18 of an AC power cord plug 3. The ferromagnetic wafer 36 acts as a ferromagnetic loop in this configuration and generates a detectable magnetic current upon current flow through AC power cord plug blades. The magnetic current generates an electrical current in a sensing coil 40 which is would about a narrow stirp 41 of the ferromagnetic wafer 36 lying between the blade slots 37. The sensing coil 40 includes lead 43 for connection to an amplifier circuit 29, FIG. 4. The ferromagnetic wafer 36 is covered by insulation, as shown in connection with FIG. 3.

Figure 6:
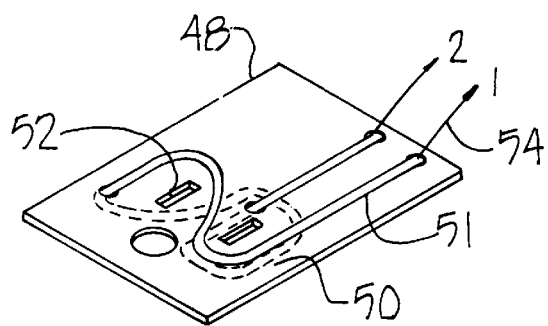
FIG. 6 is a perspective view of a second alternate embodiment of the current sensing device.

A second alternate embodiment 46 is shown in FIG. 6 in which the middle substrate layer 20 of FIG. 3 is replaced by a circuit board 48, for example, a copper-clad, double-sides etched board. The board has a multi-loop pattern 50 thereon plated with iron to form a ferromagnetic loop 51. The loop 51 encircles both blade slots 52 through the double-sided pattern and emerges as leads 54 which may be amplified as necessary through an amplifier circuit, FIG. 4. As shown in FIG. 6, the loop 51 generally forms a FIG. 8 around the slots 52 in such a manner as to generate a magnetic current.

Insulating layers as shown in FIG. 3 are applied to the circuit board 48.

In use, the current sensing device 1 is removably fitted on the end of an AC power cord plug 3 and then the plug is inserted in a typical electrical wall socket 7 or strip. Leads 26 from the ferromagnetic loop of the device 1 are connected an item of controlling equipment 9 which is signaled that current is flowing through the AC power cord 4. An amplifier circuit such as shown in FIG. 4 may or may not be necessary to provide sufficient signal strength to be sensed by the controlling equipment 9. The controlling equipment 9 is signaled if the peripheral equipment 5 is running and is able, through its appropriate logic, to not send an on/off signal if the logic determines the equipment 5 is to stay in the run mode.

As many changes can be made to the embodiments of this invention without departing from the scope of the invention, it is intended that all material be considered as illustrative of the invention and not in a limiting sense.

What is claimed and desired to be secured by Letters Patent is:

1. A current sensing device for slipping on to the plug end of an AC power cord and fitting about the blades thereof, the device comprising in combination with the AC power cord:

a) a thin, insulating substrate having a pair of slots therethrough for slipping the device on to the blades of an AC power cord plug, the substrate being sufficiently thin so as not to interfere with the fit of the plug into a wall socket;

b) a ferromagnetic loop on said substrate extending about said slots so that opposing currents in the current carrying blades of the AC power cord plug create a magnetic current in said ferromagnetic loop;

c) a sensor coil integrated with said ferromagnetic loop for generating an electrical current responsive to a change in current through the blades of the AC power cord plug and d) an AC power cord having a plug end with spaced blades for insertion into a wall socket, the power cord connected to electricity using equipment which provides a change in current flow in operational and nonoperational states.

2. A current sensing device for fitting about the blades of an AC power cord plug, the device comprising in combination with the AC power cord:

a) top and bottom insulating layers having aligned holes therethrough for fitting about the blades of an AC power cord plug;

b) a middle layer of insulating material also having holes therethrough and aligned with said holes in said insulating layers, and including means forming a ferromagnetic loop crossed over about a mid-portion to create FIG. 8 segments extending about each of said holes through said middle layer so that opposing currents in the current carrying blades of the power cord plug add to create a magnetic current in said loop;

c) a sensor coil integrated with said ferromagnetic loop for generating an electrical current responsive to a change in electrical current in the blades of the AC power cord plug d) said device being sufficiently thin so as to not interfere with the fit of the plug into a wall electrical socket; and e) an AC power cord having a plug end with spaced blades for insertion into a wall socket, the power cord connected to electricity using equipment which provides a change in current flow in operational and non-operational modes.

3. The current sensing device set forth in claim 2 wherein said FIG. 8 segments of said ferromagnetic loop join at a juncture and said sensor coil is wrapped about said juncture.

4. The current sensing device set forth in claim 2 wherein said sensor coil includes leads extending from said device for connection to peripheral equipment.

5. A current sensing device fitting about the blades of an AC power cord plug, the device comprising;
   a) an insulating substrate having spaced slots therethrough fitting about the blades of an AC power cord plug;
   b) said substrate having thereon a ferromagnetic loop crossed over about a mid portion to create FIG. 8 segments extending about each of said slots so that opposing currents in the current carrying blades of the AC power cord plug add to create a magnetic current in said loop;
   c) a sensor coil integrated with said ferromagnetic loop generating an electrical current responsive to a change in current in the blades of the AC power cord plug
   d) said device being sufficiently thin so as to not interfere with the fit of the plug into a wall electrical socket; and
   e) an AC power cord having a plug end with spaced blades for insertion into a wall socket, the power cord connected to electricity using equipment which provides a change in current flow in operational and non-operational modes.

6. A current sensing device fitting about the blades of an AC power cord plug, the device comprising;
   a) a ferromagnetic wafer having spaced slots therethrough for fitting about the blades of an AC power cord plug, said slots forming a loop with FIG. 8 segments so that opposing currents in the current carrying blades of the AC power cord plug add to create a magnetic current in said loop
   b) a sensor coil integrated with said magnetic loop for generating an electrical current responsive to a change in current in the blades of the AC power cord plug;
   c) an insulating covering extending about said ferromagnetic wafer and;
   d) said wafer being sufficiently thin so as to not interfere with the fit of the plug into a wall electrical socket.

7. The current sensing wafer set forth in claim 6 is thin and of a thickness substantially less than the length of said blades so that said wafer fits over the blades and an AC power cord plug may be plugged into a power receptacle.

* * * * *